United States Patent
Hirano et al.

(10) Patent No.: US 11,917,382 B2
(45) Date of Patent: Feb. 27, 2024

(54) IN-VEHICLE ACOUSTIC SYSTEM AND VEHICLE PROVIDED WITH THIS IN-VEHICLE ACOUSTIC SYSTEM

(71) Applicant: YAMAHA CORPORATION, Hamamatsu (JP)

(72) Inventors: Katsuya Hirano, Hamamatsu (JP); Tomokazu Hikida, Hamamatsu (JP); Takakazu Nakashima, Hamamatsu (JP)

(73) Assignee: YAMAHA Corporation, Shizuoka (JP)

( * ) Notice: Subject to any disclaimer, the term of this patent is extended or adjusted under 35 U.S.C. 154(b) by 45 days.

(21) Appl. No.: 17/303,824

(22) Filed: Jun. 8, 2021

(65) Prior Publication Data

US 2021/0392436 A1 Dec. 16, 2021

(30) Foreign Application Priority Data

Jun. 10, 2020 (JP) .................. 2020-100712

(51) Int. Cl.
| | | |
|---|---|---|
| H04R 5/02 | (2006.01) | |
| H04R 1/02 | (2006.01) | |
| H04R 3/12 | (2006.01) | |
| H03F 3/183 | (2006.01) | |
| H04R 1/22 | (2006.01) | |

(52) U.S. Cl.
CPC .............. *H04R 5/02* (2013.01); *H03F 3/183* (2013.01); *H04R 1/025* (2013.01); *H04R 1/22* (2013.01); *H04R 3/12* (2013.01); *H03F 2200/03* (2013.01); *H04R 2499/13* (2013.01)

(58) Field of Classification Search
None
See application file for complete search history.

(56) References Cited

U.S. PATENT DOCUMENTS 5,111,508 A * 5/1992 Gale ................. H04S 7/307
381/100
10,313,819 B1 * 6/2019 Dublin ............... H04S 7/302
(Continued)

FOREIGN PATENT DOCUMENTS

| CN | 102075833 A | 5/2011 |
|---|---|---|
| JP | 3153101 U | 8/2009 |
| JP | 2012074780 A | 4/2012 |

OTHER PUBLICATIONS

Notice of Frist Examination cited in Chinese Application No. 202110585603, dated Nov. 8, 2023.

*Primary Examiner* — Duc Nguyen
*Assistant Examiner* — Assad Mohammed
(74) *Attorney, Agent, or Firm* — CHIP LAW GROUP (57) ABSTRACT

An in-vehicle acoustic system includes a first amplifier that outputs a first audio signal to a first mid-range speaker; a second amplifier that outputs a second audio signal to a second mid-range speaker; a third amplifier that outputs a third audio signal to a first high-range speaker and a first low-range speaker; and a fourth amplifier that outputs a fourth audio signal to a second high-range speaker and a second low-range speaker, in which the third audio signal is inputted to the first high-range speaker, the fourth audio signal is inputted to the second high-range speaker, the first audio signal is inputted to a deep-bass speaker, the third audio signal is inputted to the first low-range speaker, the fourth audio signal is inputted to the second low-range speaker.

7 Claims, 5 Drawing Sheets

(56) References Cited

U.S. PATENT DOCUMENTS

| | | | | |
|---|---|---|---|---|
| 2014/0307881 | A1* | 10/2014 | Fuertes, III | H04R 29/001 |
| | | | | 381/59 |
| 2015/0264460 | A1* | 9/2015 | Yanagihara | H04R 1/028 |
| | | | | 381/333 |
| 2017/0208392 | A1* | 7/2017 | Smithers | H04S 7/307 |
| 2018/0146290 | A1* | 5/2018 | Christoph | H04R 3/04 |
| 2018/0343521 | A1* | 11/2018 | Ashrafzadeh | H04S 3/008 |

* cited by examiner

IN-VEHICLE ACOUSTIC SYSTEM AND VEHICLE PROVIDED WITH THIS IN-VEHICLE ACOUSTIC SYSTEM

BACKGROUND

The present disclosure relates to an in-vehicle acoustic system and a vehicle provided with this in-vehicle acoustic system.

Japanese Patent Laid-open No. 2012-74780 discloses a technique in which a woofer of a dual voice coil speaker is driven using an R signal that is inputted to a right tweeter and an L signal that is inputted to a left tweeter. Japanese Patent No. 3153101 discloses a technique in which a woofer of a dual voice coil speaker is driven using an R signal that is inputted to a right full-range speaker and an L signal that is inputted to a left full-range speaker.

SUMMARY

In an in-vehicle acoustic system that outputs musical tones and the like inside a vehicle interior of a vehicle such as a passenger car, it is common to drive a woofer and a tweeter provided at the front left, a woofer and a tweeter provided at the front right, a woofer and a tweeter provided at the rear left, and a woofer and a tweeter provided at the rear right by a four-channel amplifier, but additionally providing a subwoofer in order to make it possible to output powerful audio that is rich with deep bass has been proposed. When providing a subwoofer in addition to woofers and tweeters on the left and right at the front and the rear, consideration can be given to driving these speakers with an amplifier that has five or more channels or using an amplifier that is separate from a four-channel amplifier and is for driving the subwoofer. However, there is a problem that the cost increases with a mode in which an amplifier having five or more channels is used and a mode in which a separate amplifier for deep bass is provided.

In a mode in which a woofer is driven as a set with a tweeter as disclosed in Japanese Patent Laid-open No. 2012-74780, the occurrence of high frequency noise is a concern. With an in-vehicle acoustic system, there are demands to output the bass range at a high volume. Accordingly, a woofer is often driven using an audio signal clipped to a power-supply voltage. In this case, the audio signal clipped to the power-supply voltage is also inputted to a tweeter. Because the tweeter has an ability to output high frequency components, a high frequency component that occurs due to the clipping is emitted as high frequency noise. Similarly, the occurrence of high frequency noise is also a concern when driving a full-range speaker and a woofer as a set, as with the technique disclosed in Japanese Patent No. 3153101.

The present disclosure is made in light of the problem as described above, and it is desirable to make it possible to output audio having a wide frequency band from a deep-bass range to a high range without increasing the number of channels of an in-vehicle acoustic system having a four-channel amplifier and without adding an amplifier for deep bass.

One mode of an in-vehicle acoustic system according to an embodiment of the present disclosure has a first amplifier that outputs a first audio signal to a first mid-range speaker through a first signal path; a second amplifier that outputs a second audio signal to a second mid-range speaker through a second signal path; a third amplifier that outputs a third audio signal to a first high-range speaker and a first low-range speaker; and a fourth amplifier that outputs a fourth audio signal to a second high-range speaker and a second low-range speaker. The third audio signal is inputted to the first high-range speaker through a third signal path that goes from the third amplifier to the first high-range speaker. The fourth audio signal is inputted to the second high-range speaker through a fourth signal path that goes from the fourth amplifier to the second high-range speaker. The first audio signal is inputted to a deep-bass speaker through a fifth signal path that branches from the first signal path. The third audio signal is inputted to the first low-range speaker through a sixth signal path that branches from the third signal path. The fourth audio signal is inputted to the second low-range speaker through a seventh signal path that branches from the fourth signal path. The first mid-range speaker, the first high-range speaker, and the first low-range speaker are provided on the same side that is one of the left and right of the vehicle. The second mid-range speaker, the second high-range speaker, and the second low-range speaker are provided on the side opposite to the first mid-range speaker among the left and right of the vehicle.

One mode of an in-vehicle acoustic system according to an embodiment of the present disclosure has a first amplifier that outputs a first audio signal to a first mid-range speaker through a first signal path; a second amplifier that outputs a second audio signal to a second mid-range speaker through a second signal path; a third amplifier that outputs a third audio signal to a first full-range speaker through a third signal path; and a fourth amplifier that outputs a fourth audio signal to a second full-range speaker through a fourth signal path. The first audio signal is inputted to a deep-bass speaker through a fifth signal path that branches from the first signal path. The first mid-range speaker and the first full-range speaker are provided on the same side that is one of the left and right of the vehicle. The second mid-range speaker and the second full-range speaker are provided on the side opposite to the first mid-range speaker among the left and right of the vehicle.

One mode of a vehicle according to an embodiment of the present disclosure is provided with an in-vehicle acoustic system according to any of the above modes.

DETAIED DESCRIPTION OF THE PREFERRED EMBODIMENTS

With reference to the drawings, description is given below regarding embodiments according to the present disclosure.

Note that the dimensions and scale of each part or unit in the drawings may differ as appropriate from those of actual parts and units. Embodiments described below are desirable, specific examples of the present disclosure. Accordingly, various technically desirable limitations are applied to the following embodiments. However, the scope of the present disclosure is not limited to what is described in these embodiments unless, in the following description, there is language in particular that limits the present disclosure.

1. Embodiment

Figure 1:
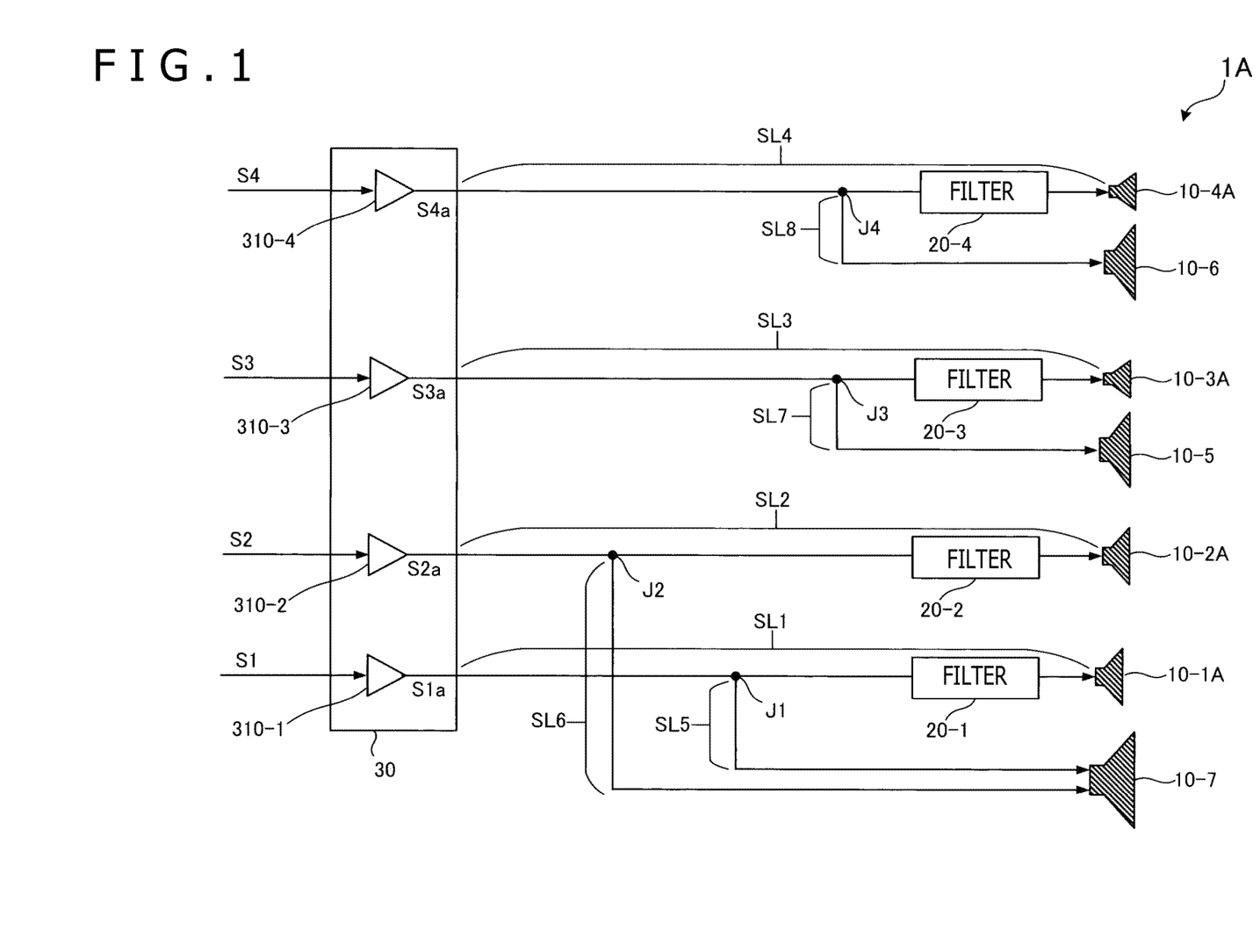
FIG. 1 is a view that illustrates an example of a configuration of an acoustic system 1A according to an embodiment of the present disclosure.

FIG. 1 is a view that illustrates an example of a configuration of an acoustic system 1A according to an embodiment of the present disclosure. As illustrated in FIG. 1, the acoustic system 1A includes a speaker 10-1A, a speaker 10-2A, a speaker 10-3A, a speaker 10-4A, a speaker 10-5, a speaker 10-6, a speaker 10-7, filters 20-1 through 20-4, and a drive device 30 that drives each of the speakers 10-1A through 10-7. The acoustic system 1A is an in-vehicle acoustic system that is mounted in a vehicle such as a passenger car, and outputs musical tones and the like inside the vehicle interior of the vehicle. The speaker 10-1A, the speaker 10-2A, and the speaker 10-7 are provided at the rear in the vehicle interior. The speaker 10-3A, the speaker 10-4A, the speaker 10-5, and the speaker 10-6 are provided at the front in the vehicle interior. The speaker 10-1A, the speaker 10-3A, and the speaker 10-5 are provided on the right side of the vehicle interior. The speaker 10-2A, the speaker 10-4A, and the speaker 10-6 are provided on the left side of the vehicle interior. Details of the disposition of the speakers 10-1A through 10-7 are clarified later.

The speaker 10-1A and the speaker 10-2A are squawkers. The speaker 10-3A and the speaker 10-4A are tweeters. The speaker 10-5 and the speaker 10-6 are woofers. The speaker 10-7 is a subwoofer. The reproduction frequency band of the speaker 10-5 expands more on the low range side in comparison to the reproduction frequency band of the speaker 10-3A. A reproduction frequency band refers to a frequency band for which a measurement value for sound pressure does not decrease by 20 dB or more when a sinusoidal voltage corresponding to 1 W is applied to the input terminal of a speaker and the sound pressure is measured at a position 1 m away from the speaker on a reference axis. The reproduction frequency band of the speaker 10-5 partially overlaps with the reproduction frequency band of the speaker 10-3A. Specifically, a graph that represents the reproduction frequency band of the speaker 10-5 and a graph that represents the reproduction frequency band of the speaker 10-3A intersect at around 2 to 4 kHz. The reproduction frequency band of the speaker 10-6 also expands more on the low range side in comparison to the reproduction frequency band of the speaker 10-4A. The reproduction frequency band of the speaker 10-6 partially overlaps with the reproduction frequency band of the speaker 10-4A. A graph that represents the reproduction frequency band of the speaker 10-6 and a graph that represents the reproduction frequency band of the speaker 10-4A intersect at around 2 to 4 kHz.

The reproduction frequency band of the speaker 10-1A partially overlaps with the reproduction frequency band of the speaker 10-3A, and also partially overlaps with the reproduction frequency band of the speaker 10-5. The reproduction frequency band of the speaker 10-3A expands more on the high range side in comparison to the reproduction frequency band of the speaker 10-1A. The reproduction frequency band of the speaker 10-5 expands more on the low range side in comparison to the reproduction frequency band of the speaker 10-1A. A graph that represents the reproduction frequency band of the speaker 10-1A and a graph that represents the reproduction frequency band of the speaker 10-5 intersect at around 200 to 400 Hz. The reproduction frequency band of the speaker 10-2A partially overlaps with the reproduction frequency band of the speaker 10-4A, and also partially overlaps with the reproduction frequency band of the speaker 10-6. The reproduction frequency band of the speaker 10-4A expands on the high range side in comparison to the reproduction frequency band of the speaker 10-2A. The reproduction frequency band of the speaker 10-6 expands more on the low range side in comparison to the reproduction frequency band of the speaker 10-2A. A graph that represents the reproduction frequency band of the speaker 10-2A and a graph that represents the reproduction frequency band of the speaker 10-6 intersect at around 200 to 400 Hz.

The speaker 10-1A is an example of a first mid-range speaker in the present disclosure. The speaker 10-2A is an example of a second mid-range speaker in the present disclosure. The speaker 10-3A is an example of a first high-range speaker in the present disclosure. The speaker 10-4A is an example of a second high-range speaker in the present disclosure. The speaker 10-5 is an example of a first low-range speaker in the present disclosure. The speaker 10-6 is an example of a second low-range speaker in the present disclosure.

The reproduction frequency band of the speaker 10-7 partially overlaps with the reproduction frequency band of the speaker 10-5. The reproduction frequency band of the speaker 10-7 expands more on the low range side in comparison to the reproduction frequency band of the speaker 10-5. A graph that represents the reproduction frequency band of the speaker 10-7 and a graph that represents the reproduction frequency band of the speaker 10-5 intersect at around 100 to 200 Hz. The reproduction frequency band of the speaker 10-7 also partially overlaps with the reproduction frequency band of the speaker 10-6. The reproduction frequency band of the speaker 10-7 expands more on the low range side in comparison to the reproduction frequency band of the speaker 10-6. A graph that represents the reproduction frequency band of the speaker 10-7 and a graph that represents the reproduction frequency band of the speaker 10-6 intersect at around 100 to 200 Hz. The speaker 10-7 is an example of a deep-bass speaker that is responsible for reproducing a deep-bass range.

Although detailed illustration is omitted in FIG. 1, the speaker 10-7 is a double voice coil speaker that has two voice coils. One of the two voice coils that the speaker 10-7 has is supplied with an audio signal S1a via a signal path SL5 that branches from a signal path SL1 that goes from the drive device 30 to the speaker 10-1A. The voice coil that is supplied with the audio signal S1a via the signal path SL5 is an example of a first voice coil in the present disclosure. The other of the two voice coils that the speaker 10-7 has is supplied with an audio signal S2a via a signal path SL6 that branches from a signal path SL2 that goes from the drive device 30 to the speaker 10-2A. The voice coil that is supplied with the audio signal S2a via the signal path SL6 is an example of a second voice coil in the present disclosure. Because, in the present embodiment, the speaker 10-7 is driven by two audio signals, i.e., the audio signal S1a and the audio signal S2a, it is possible to have a higher output sound pressure in comparison to a mode in which the speaker 10-7 is driven by one of the audio signal S1a and the audio signal S2a. If the speaker 10-7 is a double voice coil speaker, the efficiency of the speaker 10-7 may be lower in comparison to a mode in which a single voice coil speaker is used as the speaker 10-7. Because the speaker 10-7 in the present embodiment is a double voice coil speaker, it is possible to omit a circuit that generates a monaural audio signal from the audio signal S1a and the audio signal S2a.

The drive device 30 is installed in, for example, a console of the vehicle in which the acoustic system 1A is mounted. Audio signals S1 to S4 are supplied to the drive device 30 via a preamplifier or the like which is not illustrated. Each of the audio signals S1 to S4 is obtained after performing volume adjustment, mixing, and the like on various audio signals such as musical-performance sounds and a singing voice of a piece of music. In the present embodiment, each of the audio signals S1 to S4 is an audio signal obtained by mixing an audio signal for a musical-performance sound and an audio signal for a singing voice of a piece of music. In more detail, the audio signal S1 and the audio signal S3 are right-channel audio signals when reproducing the piece of music in stereo. The audio signal S2 and the audio signal S4 are left-channel audio signals when reproducing the piece of music in stereo. The audio signal S1 and the audio signal S2 include frequency components of a frequency band that extends from a deep-bass range to a high range. The audio signal S3 and the audio signal S4 include frequency components of a frequency band that extends from a bass range to a high range. The audio signals S1 to S4 may all be the same audio signal.

The drive device 30 is a four-channel amplifier. The drive device 30 has amplifiers 310-1 to 310-4 that respectively amplify and output the audio signals S1 to S4. The amplifier 310-1 amplifies the audio signal S1 to a level suitable for speaker driving. The amplifier 310-1 outputs an amplified audio signal S1a to the signal path SL1 which goes to the speaker 10-1A. The amplifier 310-1 is an example of a first amplifier in the present disclosure. The signal path SL1, which goes from the amplifier 310-1 to the speaker 10-1A, is an example of a first signal path in the present disclosure. The audio signal S1a is an example of a first audio signal in the present disclosure. The signal path SL5, which branches from the signal path SL1 and goes to the speaker 10-7, is an example of a fifth signal path in the present disclosure.

As illustrated in FIG. 1, the filter 20-1 is provided on the signal path SL1 between the speaker 10-1A and a branch point J1 for the signal path SL5. The filter 20-1 in the present embodiment is a high pass filter that allows signals having a frequency greater than or equal to a cutoff frequency pass, and blocks signals having a frequency less than the cutoff frequency. The cutoff frequency of the filter 20-1 is defined according to a lower limit frequency of the reproduction frequency band of the speaker 10-1A. More specifically, the cutoff frequency of the filter 20-1 is set near the lower limit frequency of the reproduction frequency band of the speaker 10-1A. The filter 20-1 is provided in order to avoid damage to the speaker 10-1A due to an audio signal having a frequency less than the cutoff frequency being supplied to the speaker 10-1A. The filter 20-1 of the present embodiment is a high pass filter, but may be a bandpass filter. The filter 20-1 is an example of a first filter in the present disclosure.

The amplifier 310-2 amplifies the audio signal S2 to a level suitable for speaker driving. The amplifier 310-2 outputs an amplified audio signal S2a to the signal path SL2 which goes to the speaker 10-2A. The amplifier 310-2 is an example of a second amplifier in the present disclosure. The signal path SL2, which goes from the amplifier 310-2 to the speaker 10-2A, is an example of a second signal path in the present disclosure. The audio signal S2a is an example of a second audio signal in the present disclosure. The signal path SL6, which branches from the signal path SL2 and goes to the speaker 10-7, is an example of an eighth signal path in the present disclosure. As illustrated in FIG. 1, the filter 20-2 is provided on the signal path SL2 between the speaker 10-2A and a branch point J2 for the signal path SL6. The filter 20-2 is also a high pass filter, similarly to the filter 20-1. The cutoff frequency of the filter 20-2 is set near the lower limit frequency of the reproduction frequency band of the speaker 10-2A. The filter 20-2 is provided to avoid damaging the speaker 10-2A, similarly to the filter 20-1. The filter 20-2 may be a bandpass filter, similarly to the filter 20-1. The filter 20-2 is an example of a second filter in the present disclosure.

The amplifier 310-3 amplifies the audio signal S3 to a level suitable for speaker driving. The amplifier 310-3 outputs an amplified audio signal S3a to the signal path SL3 which goes to the speaker 10-3A. The amplifier 310-3 is an example of a third amplifier in the present disclosure. The signal path SL3, which goes from the amplifier 310-3 to the speaker 10-3A, is an example of a third signal path in the present disclosure. The audio signal S3a is an example of a third audio signal in the present disclosure. As illustrated in FIG. 1, a signal path SL7, which goes to the speaker 10-5, branches from the signal path SL3 in the present embodiment. The signal path SL7 is an example of a sixth signal path in the present disclosure. As illustrated in FIG. 1, the filter 20-3 is provided on the signal path SL3 between the speaker 10-3A and a branch point J3 for the signal path SL7. The filter 20-3 is also a high pass filter, similarly to the filter 20-1. The cutoff frequency of the filter 20-3 is set near the lower limit frequency of the reproduction frequency band of the speaker 10-3A. The filter 20-3 is provided to avoid damaging the speaker 10-3A, similarly to the filter 20-1. In addition, the filter 20-3 also has a role of audio quality adjustment that flattens the frequency response of a portion where the reproduction frequency band of the speaker 10-3A and the reproduction frequency band of the speaker 10-5 overlap. The filter 20-3 may be a bandpass filter, similarly to the filter 20-1. The filter 20-3 is an example of a third filter in the present disclosure.

The amplifier 310-4 amplifies the audio signal S4 to a level suitable for speaker driving. The amplifier 310-4 outputs an amplified audio signal S4a to the signal path SL4 which goes to the speaker 10-4A. The amplifier 310-4 is an example of a fourth amplifier in the present disclosure. The signal path SL4 is an example of a fourth signal path in the present disclosure. The audio signal S4a is an example of a fourth audio signal in the present disclosure. As illustrated in FIG. 1, a signal path SL8, which goes to the speaker 10-6, branches from the signal path SL4 in the present embodiment. The signal path SL8 is an example of a seventh signal path in the present disclosure. As illustrated in FIG. 1, the filter 20-4 is provided on the signal path SL4 between the speaker 10-4A and a branch point J4 for the signal path SL8. The filter 20-4 is also a high pass filter, similarly to the filter 20-1. The cutoff frequency of the filter 20-4 is set near the lower limit frequency of the reproduction frequency band of the speaker 10-4A. The filter 20-4 is provided for audio quality adjustment and avoidance of damaging of the speaker 10-4A, similarly to the filter 20-3. The filter 20-4 may be a bandpass filter, similarly to the filter 20-1. The filter 20-4 is an example of a fourth filter in the present disclosure.

In the present embodiment, the amplifier 310-1 drives the speaker 10-1A and the speaker 10-7. The amplifier 310-2 drives the speaker 10-2A and the speaker 10-7. The amplifier 310-3 drives the speaker 10-3A and the speaker 10-5. The amplifier 310-4 drives the speaker 10-4A and the speaker 10-6.

Figure 2:
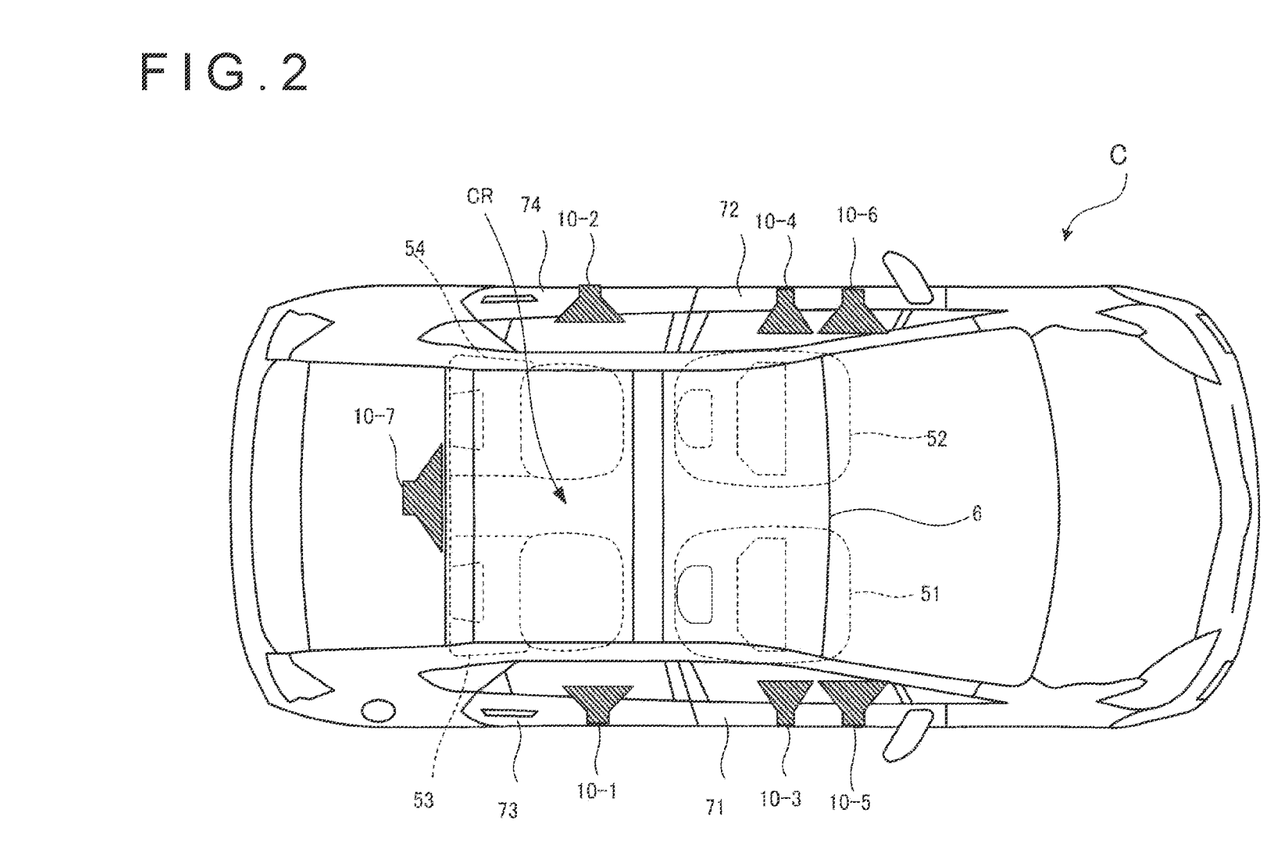
FIG. 2 is a view that illustrates an example of disposing speakers 10-1A through 10-7 in a vehicle interior CR of a vehicle C in which the acoustic system 1A is mounted.

FIG. 2 is a plan view of a vehicle C in which the acoustic system 1A is mounted. In FIG. 2, illustration of the filters 20-1 to 20-4 and the drive device 30 is omitted. Four seats 51 to 54 disposed rectangularly, a ceiling 6, a front right door 71, a front left door 72, a rear right door 73, and a rear left door 74 are disposed in a vehicle interior CR of the vehicle C. When the vehicle C is a product for Japan, the seat 51 is the driver's seat, and the seat 52 is a passenger seat. However, when the vehicle C is a product for the United States or the European Union, the seat 51 is a passenger seat, and the seat 52 is the driver's seat. In the following description, it is envisioned that the vehicle C is a product for Japan. The seat 53 is the rear right seat, and the seat 54 is the rear left seat. The seats 51 to 54 face the same direction. The seat 51 and the seat 52 may be referred to below as the "front seats," and the seat 53 and the seat 54 may be referred to below as the "rear seats."

As illustrated in FIG. 2, the speaker 10-7 is disposed rearward of the rear seats in the present embodiment. To give a more specific description, the speaker 10-7 is disposed rearward of the seat 53 and the seat 54 at a position between the seat 53 and the seat 54, as illustrated in FIG. 2. In the present embodiment, each of the speakers 10-1A, 10-2A, 10-3A, 10-4A, 10-5, and 10-6 is what is generally called a door speaker. As illustrated in FIG. 2, the speaker 10-3A and the speaker 10-5 are disposed on the front right door 71 with an orientation in which respective sound emitting surfaces face the seat 51. As illustrated in FIG. 2, the speaker 10-4A and the speaker 10-6 are disposed on the front left door 72 with an orientation in which respective sound emitting surfaces face the seat 52. As illustrated in FIG. 2, the speaker 10-1A is disposed on the rear right door 73 with an orientation in which the sound emitting surface faces the seat 53. The speaker 10-2A is disposed on the rear left door 74 with an orientation in which the sound emitting surface faces the seat 54.

Figure 3:
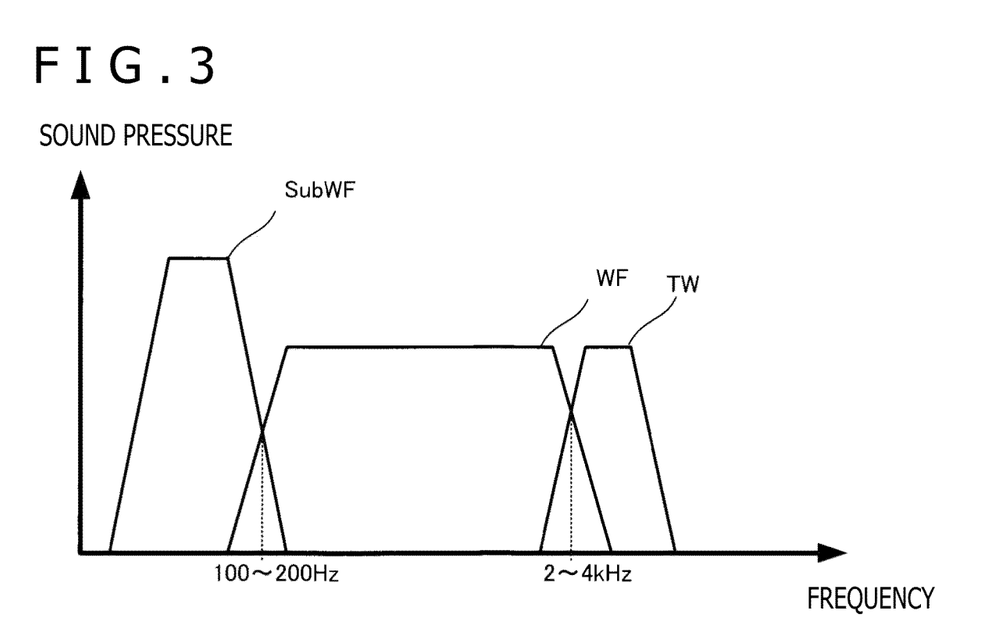
FIG. 3 is a view that illustrates an example of a frequency distribution for sound pressure measured at a front seat of the vehicle C that has the acoustic system 1A.

FIG. 3 is a graph that illustrates an example of a frequency distribution for audio sound pressure measured at a front seat of the vehicle C that has the acoustic system 1A. A graph SubWF in FIG. 3 indicates a sound pressure frequency distribution for deep-bass range audio that is generated by the speaker 10-7. A graph WF in FIG. 3 indicates a sound pressure frequency distribution for low range audio that is generated by the speaker 10-5 and the speaker 10-6. A graph TW in FIG. 3 indicates a sound pressure frequency distribution for high range audio that is generated by the speaker 10-3A and the speaker 10-4A. As illustrated in FIG. 3, audio for which the sound pressure is distributed from the deep-bass range to the high range without a gap is measured at the front seats. Accordingly, an occupant who is seated in a front seat can listen to audio having a frequency band that ranges from the deep-bass range to the high range.

Figure 4:
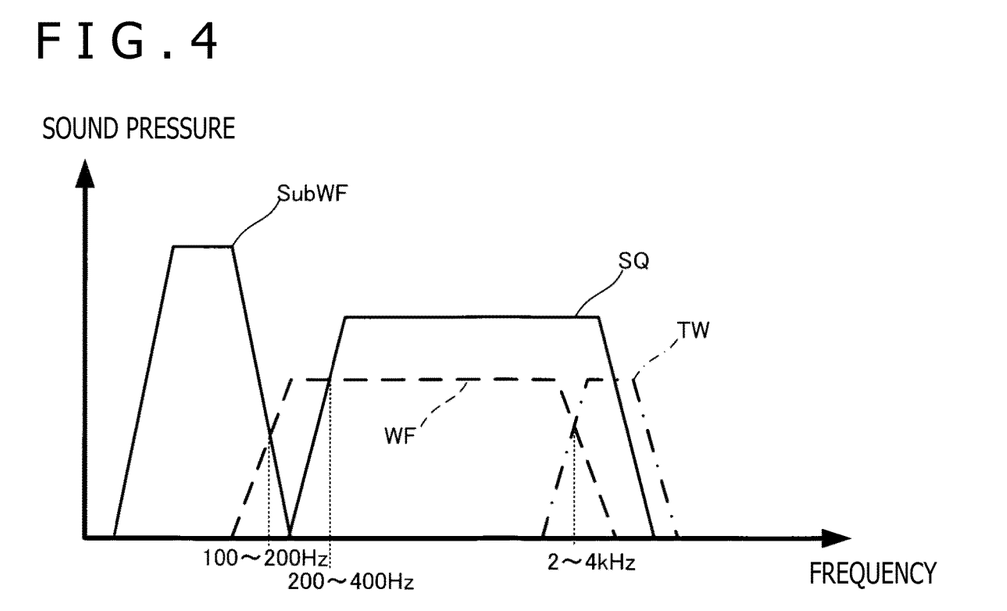
FIG. 4 is a view that illustrates an example of a frequency distribution for sound pressure measured at a rear seat of the vehicle C that has the acoustic system 1A.

FIG. 4 is a graph that illustrates an example of a frequency distribution for audio sound pressure measured at a rear seat of the vehicle C that has the acoustic system 1A. A graph SQ in FIG. 4 indicates a sound pressure frequency distribution for mid-range audio that is generated by the speaker 10-1A and the speaker 10-2A. The graph SubWF, the graph WF, and the graph TW are similar to those in FIG. 3.

The reproduction frequency band of the speaker 10-1A expands more on the high range side in comparison to the reproduction frequency band of the speaker 10-5. Similarly, the reproduction frequency band of the speaker 10-2A expands more on the high range side in comparison to the reproduction frequency band of the speaker 10-6. Accordingly, if only the speaker 10-1A and the speaker 10-2A were present without the speaker 10-5 and the speaker 10-6, there would be insufficient low range sound pressure. However, in the present embodiment, the low range sound pressure is supplemented by the sound outputted from the speaker 10-5 and the speaker 10-6. In FIG. 4, a situation where low range sound pressure is supplemented by sound outputted by the speaker 10-5 and the speaker 10-6 is indicated by a broken-line graph. The reproduction frequency band of the speaker 10-1A also expands more on the low range side in comparison to the reproduction frequency band of the speaker 10-3A. Similarly, the reproduction frequency band of the speaker 10-2A also expands more on the low range side in comparison to the reproduction frequency band of the speaker 10-4A. Accordingly, if only the speaker 10-1A and the speaker 10-2A were present without the speaker 10-3A and the speaker 10-4A, there would be insufficient high range sound pressure. However, in the present embodiment, the high range sound pressure is supplemented by the sound outputted from the speaker 10-3A and the speaker 10-4A. In FIG. 4, a situation where high range sound pressure is supplemented by sound outputted by the speaker 10-3A and the speaker 10-4A is indicated by a dashed-dotted-line graph. Accordingly, by virtue of the acoustic system 1A of the present embodiment, an occupant who is seated in a rear seat can also listen to audio of a frequency band that ranges from the deep-bass range to the high range.

In addition, in the present embodiment, the speaker 10-1A and the speaker 10-2A, which are driven as a set with the speaker 10-7 which is a subwoofer, are squawkers. As described above, the reproduction frequency band of the speaker 10-1A also expands more on the low range side in comparison to the reproduction frequency band of the speaker 10-3A which is a tweeter. Similarly, the reproduction frequency band of the speaker 10-2A also expands more on the low range side in comparison to the reproduction frequency band of the speaker 10-4A which is a tweeter. Accordingly, even if the amplitude of one of or both the audio signal S1 and the audio signal S2 is lifted up in the preamplifier by a portion for driving the speaker 10-7 and clipping occurs in one of or both the amplifier 310-1 and the amplifier 310-2, high frequency noise due to clipping of the input signal will not be outputted from the speaker 10-1A or the speaker 10-2A. In addition, because the sound pressure distribution for the deep-bass range is defined according to the shape of the vehicle interior CR, even if the amplitude of the audio signal S1 and that of the audio signal S2 are increased, it is not necessarily the case that the sound pressure for the deep-bass range will be higher in a rear seat in comparison to a front seat, and it is not necessarily the case that the balance for sound pressure ranging from the deep-bass range to the high range will break down at the rear seats.

By virtue of the present embodiment as described above, it is possible to output audio having a wide frequency band from a deep-bass range to a high range, without increasing the number of channels for the drive device 30 and without adding an amplifier for deep bass. In addition, by virtue of the present embodiment, it is possible to drive a subwoofer while avoiding output of high frequency noise from a speaker that is driven as a set with the subwoofer.

2. Modifications

The above embodiment can be modified in many ways. Examples of specific modified modes are given below. Two or more modes selected optionally from the following examples can be merged as appropriate, as long as there are no contradictions.

2-1. Modification 1

The speaker 10-1A, the speaker 10-2A, the speaker 10-3A, the speaker 10-4A, the speaker 10-5, and the speaker 10-6 are not limited to door speakers. For example, the speaker 10-3A and the speaker 10-4A may be disposed on the top surface of the front dashboard or as a part of an A-pillar. Each of the speaker 10-1A, the speaker 10-2A, the speaker 10-3A, the speaker 10-4A, the speaker 10-5, and the speaker 10-6 may not be facing a seat. In the embodiment described above, the speaker 10-1A, the speaker 10-2A, and the speaker 10-7 are disposed on the rear seat side, and the speaker 10-3A, the speaker 10-4A, the speaker 10-5, and the speaker 10-6 are disposed on the front seat side. However, the speakers 10-3A through 10-6 may be disposed on the rear seat side, and the speaker 10-1A, the speaker 10-2A, and the speaker 10-7 may be disposed on the front seat side. For example, when the speaker 10-1A, the speaker 10-2A, and the speaker 10-7 are disposed on the front seat side, the speaker 10-7 may be disposed below the passenger seat or the driver's seat. In the embodiment described above, description has been given regarding the acoustic system 1A according to an embodiment of the present disclosure, but the vehicle C in which the acoustic system 1A is mounted may be manufactured or sold.

2-2. Modification 2

The efficiency of the speaker 10-7 may be greater than or equal to the efficiency of the speaker 10-5. The efficiency of the speaker 10-7 may also be greater than or equal to the efficiency of the speaker 10-6. When the efficiency of the speaker 10-7 is greater than or equal to the efficiency of the speaker 10-5, the gain of the amplifier 310-1 may be less than or equal to the gain of the amplifier 310-3. Similarly, when the efficiency of the speaker 10-7 is greater than or equal to the efficiency of the speaker 10-6, the gain of the amplifier 310-2 may be less than or equal to the gain of the amplifier 310-4.

2-3. Modification 3

In the embodiment described above, the speaker 10-7 is given as a double voice coil speaker, but a subwoofer that has one voice coil may be used as the speaker 10-7. In a mode in which a subwoofer having one voice coil is used as the speaker 10-7, it is sufficient if the speaker 10-7 is supplied with one of the audio signal S1*a* and the audio signal S2*a* or a monaural audio signal generated from the audio signal S1*a* and the audio signal S2*a*.

2-4. Modification 4

In the embodiment described above, the speaker 10-5 and the speaker 10-6 may be omitted from the acoustic system 1A illustrated in FIG. 1. This is because, even if the speaker 10-5 and the speaker 10-6 are omitted, low range sound pressure heard by an occupant in a front seat can be supplemented by audio outputted from the speaker 10-1A and the speaker 10-2A. In a mode in which the speaker 10-5 and the speaker 10-6 are omitted, it is desirable to have the upper limit frequency of the reproduction frequency band of the speaker 10-7 be higher than that in the embodiment described above. This is in order to supplement low range audio heard by an occupant in a front seat with the audio outputted from the speaker 10-7. The filters 20-1 to 20-4 in the embodiment described above are not necessarily needed, and may be omitted. In addition, the speaker 10-1A, the speaker 10-2A, the speaker 10-3A, the speaker 10-4A, the speaker 10-5, the speaker 10-6, and the speaker 10-7 are not essential components of the in-vehicle acoustic system of the present disclosure. It is sufficient if the in-vehicle acoustic system of the present disclosure includes the drive device 30 that drives each of the speaker 10-1A, the speaker 10-2A, the speaker 10-3A, the speaker 10-4A, the speaker 10-5, the speaker 10-6, and the speaker 10-7.

2-5. Modification 5

Figure 5:
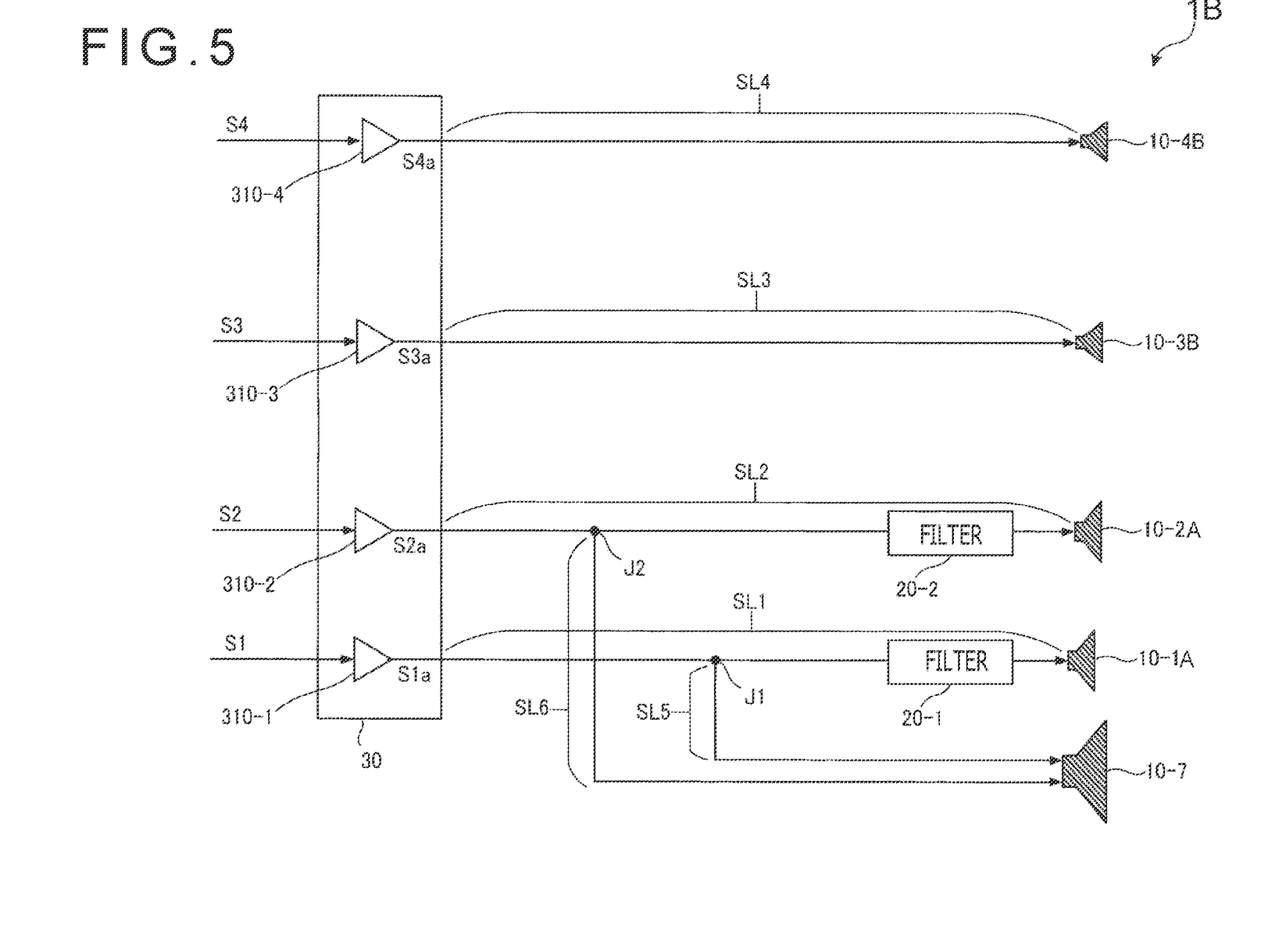
FIG. 5 is a view that illustrates an example of a configuration of an acoustic system 1B according to a modification 5.

In the embodiment described above, the speakers 10-3A and 10-5 are disposed on the right side of the front seats, and the speakers 10-4A and 10-6 are disposed on the left side of the front seats. However, a full-range speaker may be used in place of a combination of a tweeter and a woofer. In an acoustic system 1B illustrated in FIG. 5, a speaker 10-3B which is a full-range speaker is provided in place of the speakers 10-3A and 10-5, and a speaker 10-4B which is a full-range speaker is provided in place of the speakers 10-4A and 10-6. The speaker 10-3B is an example of a first full-range speaker in the present disclosure. The speaker 10-4B is an example of a second full-range speaker in the present disclosure. In the acoustic system 1B, the filters 20-3 and 20-4 are omitted because there is no need to consider audio quality adjustment and damage avoidance for the speakers 10-3B and 10-4B. Even with the present mode, it is possible to output audio having a wide frequency band from a deep-bass range to a high range, without increasing the number of channels for the drive device 30 and without adding an amplifier for deep bass. In addition, even with the present mode, it is possible to drive a subwoofer while avoiding output of high frequency noise from a speaker that is driven as a set with the subwoofer.

2-6. Modification 6

Figure 6:
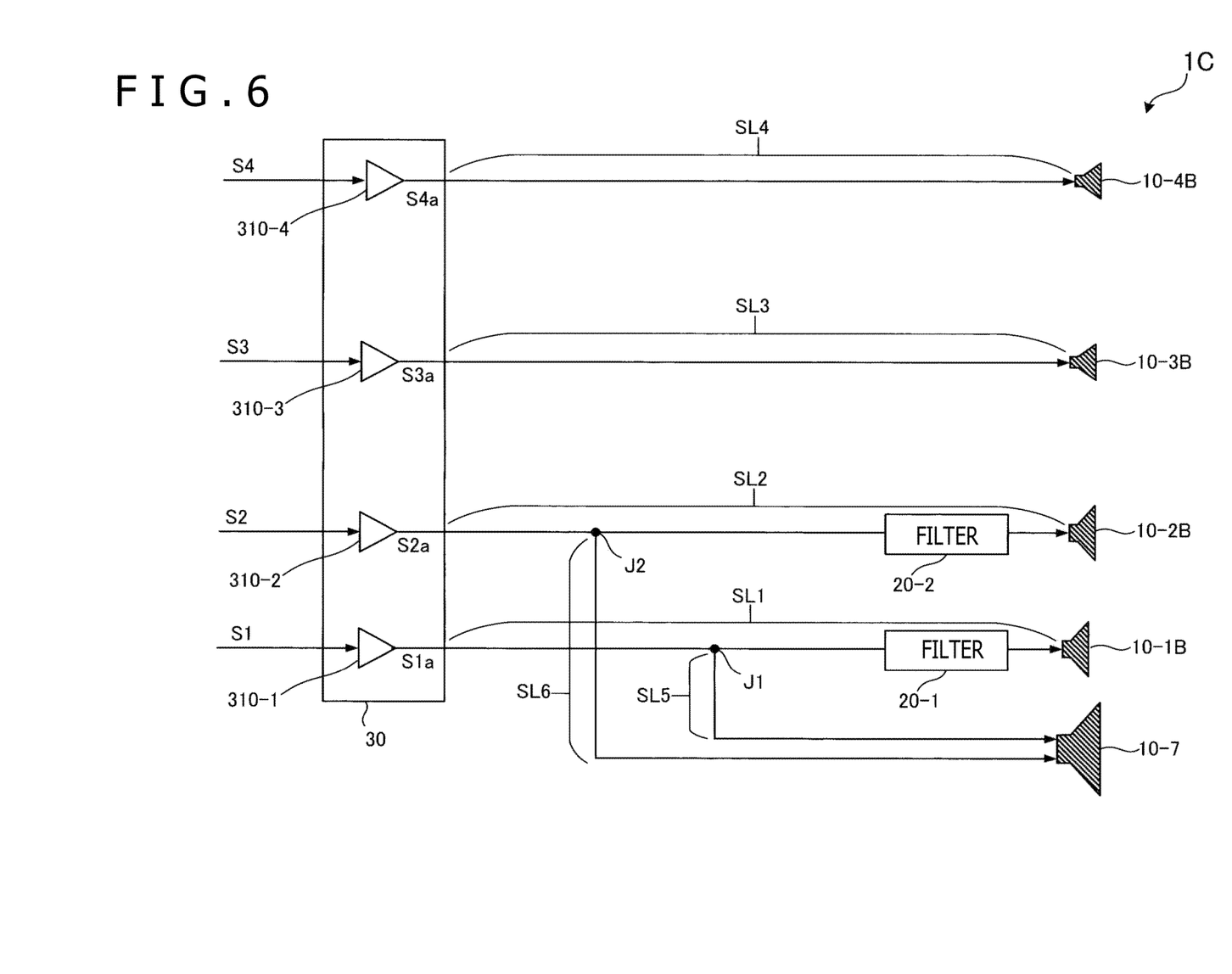
FIG. 6 is a view that illustrates an example of a configuration of an acoustic system 1C according to a modification 6.

In the embodiment described above, the speaker 10-1A and the speaker 10-2A are squawkers. However, in place of squawkers, full-range speakers may be driven as a set with the speaker 10-7. In an acoustic system 1C illustrated in FIG. 6, a speaker 10-1B which is a full-range speaker is provided in place of the speaker 10-1A, and a speaker 10-2B which is a full-range speaker is provided in place of the speaker 10-2A. In the acoustic system 1C illustrated in FIG. 6, it is possible to drive the speaker 10-7 while avoiding output of high frequency noise from the speakers 10-1B and 10-2B, by setting the cutoff frequencies for the filter 20-1 and the filter 20-2.

3. Modes Recognized from at Least One of the Embodiment and the Modifications The acoustic system 1A which is an example of an in-vehicle acoustic system of the present disclosure has the amplifier 310-1 which is an example of a first amplifier, the amplifier 310-2 which is an example of a second amplifier, the amplifier 310-3 which is an example of a third amplifier, and the amplifier 310-4 which is an example of a fourth amplifier. The first amplifier outputs the audio signal S1*a* which is an example of a first audio signal to the speaker 10-1A which is an example of a first mid-range speaker through the signal path SL1 which is an example of a first signal path. The second amplifier outputs the audio signal S2a which is an example of a second audio signal to the speaker 10-2A which is an example of a second mid-range speaker through the signal path SL2 which is an example of a second signal path. The third amplifier outputs the audio signal S3a which is an example of a third audio signal to the speaker 10-3A which is an example of a first high-range speaker and the speaker 10-5 which is an example of a first low-range speaker. The fourth amplifier outputs the audio signal S4a which is an example of a fourth audio signal to the speaker 10-4A which is an example of a second high-range speaker and the speaker 10-6 which is an example of a second low-range speaker. The third audio signal is inputted to the first high-range speaker through the signal path SL3 which is an example of a third signal path that goes from the third amplifier to the first high-range speaker. The fourth audio signal is inputted to the second high-range speaker through the signal path SL4 which is an example of a fourth signal path that goes from the fourth amplifier to the second high-range speaker. The first audio signal is inputted to the speaker 10-7 which is an example of a deep-bass speaker through the signal path SL5 which is an example of a fifth signal path that branches from the first signal path. The third audio signal is inputted to the first low-range speaker through the signal path SL7 which is an example of a sixth signal path that branches from the third signal path. The fourth audio signal is inputted to the second low-range speaker through the signal path SL8 which is an example of a seventh signal path that branches from the fourth signal path. The first mid-range speaker, the first high-range speaker, and the first low-range speaker are provided on the same side, which is one of the left and right of the vehicle C which is an example of a vehicle in the present disclosure. The second mid-range speaker, the second high-range speaker, and the second low-range speaker are provided on the side opposite to the first mid-range speaker among the left and right of the vehicle. By virtue of the present mode, because the deep-bass speaker is driven as a set with the first mid-range speaker, it is possible to output audio having a frequency band from a deep-bass range to a high range without increasing the number of channels in an in-vehicle acoustic system that has a standard four-channel amplifier and without adding an amplifier for deep bass.

In an in-vehicle acoustic system according to a more desirable mode, the reproduction frequency band of the first mid-range speaker expands more on a low range side in comparison to the reproduction frequency band of the first high-range speaker. By virtue of the present mode, by making the amplitude of the first audio signal be larger than the amplitude of the third audio signal in order to drive the deep-bass speaker, it is possible to avoid output of high frequency noise due to clipping from the first mid-range speaker even if clipping occurs at the first amplifier.

An in-vehicle acoustic system according to a more desirable mode has, on a portion of the first signal path between the first mid-range speaker and a branch point where the fifth signal path branches from the first signal path, the filter 20-1, which is an example of a first filter for which a cutoff frequency is defined according to a lower limit frequency of a reproduction frequency band of the first mid-range speaker, the filter 20-1 blocking a signal having a frequency lower than the cutoff frequency. In the in-vehicle acoustic system according to the present mode, the first filter is provided on a portion of the first signal path between the branch point J1, which is an example of a branch point where the fifth signal path branches from the first signal path, and the first mid-range speaker. By virtue of the present mode, it is possible to avoid damage to the first mid-range speaker due to input of a signal having a frequency lower than the cutoff frequency to the first mid-range speaker.

In an in-vehicle acoustic system according to a more desirable mode, the second audio signal may also be inputted to the deep-bass speaker through the signal path SL6 which is an example of an eighth signal path that branches from the second signal path. In the in-vehicle acoustic system according to the present mode, the deep-bass speaker has a first voice coil that is connected to the fifth signal path and a second voice coil that is connected to the eighth signal path. By virtue of the present mode, it is possible to omit a circuit that generates a monaural audio signal from the first audio signal and the second audio signal. In addition, by virtue of the present mode, because the deep-bass speaker is driven by the first audio signal and the second audio signal, it is possible to have a higher sound pressure in comparison to a mode in which the deep-bass speaker is driven by only the first audio signal.

In an in-vehicle acoustic system according to a more desirable mode, the reproduction frequency band of the first low-range speaker expands more on the low range side in comparison to the first mid-range speaker, and the reproduction frequency band of second low-range speaker expands more on the low range side in comparison to the second mid-range speaker. By virtue of the present mode, audio on a low range side of the reproduction frequency bands of the first mid-range speaker and the second mid-range speaker is supplemented by the first low-range speaker and the second low-range speaker, and it is thus possible to output powerful audio.

In an in-vehicle acoustic system according to a more desirable mode, the first high-range speaker, the first low-range speaker, the second high-range speaker, and the second low-range speaker are disposed at the front in the vehicle interior, and the first mid-range speaker, the second mid-range speaker, and the deep-bass speaker are disposed at the rear in the vehicle interior.

The acoustic system 1B which is an example of an in-vehicle acoustic system of the present disclosure has the amplifier 310-1 which is an example of a first amplifier, the amplifier 310-2 which is an example of a second amplifier, the amplifier 310-3 which is an example of a third amplifier, and the amplifier 310-4 which is an example of a fourth amplifier. The first amplifier outputs the audio signal S1a which is an example of a first audio signal to the speaker 10-1A which is an example of a first mid-range speaker through the signal path SL1 which is an example of a first signal path. The second amplifier outputs the audio signal S2a which is an example of a second audio signal to the speaker 10-2A which is an example of a second mid-range speaker through the signal path SL2 which is an example of a second signal path. The third amplifier outputs the audio signal S3a which is an example of a third audio signal to the speaker 10-3B which is an example of a first full-range speaker through the signal path SL3 which is an example of a third signal path. The fourth amplifier outputs the audio signal S4a which is an example of a fourth audio signal to the speaker 10-4B which is an example of a second full-range speaker through the signal path SL4 which is an example of a fourth signal path. The first audio signal is inputted to the speaker 10-7 which is an example of a deep-bass speaker through the signal path SL5 which is an example of a fifth signal path that branches from the first signal path. The first mid-range speaker and the first full-range speaker are provided on the same side, which is one of the left and right of the vehicle C which is an example of a vehicle in the present disclosure. The second mid-range speaker and the second full-range speaker are provided on the side opposite to the first mid-range speaker among the left and right of the vehicle. In the present mode, because the deep-bass speaker is driven as a set with the first mid-range speaker, it is also possible to output audio having a frequency band from a deep-bass range to a high range without increasing the number of channels in an in-vehicle acoustic system that has a standard four-channel amplifier and without adding an amplifier for deep bass.

The vehicle C which is an example of a vehicle according to an embodiment of the present disclosure includes an in-vehicle acoustic system according to any of the above modes. By virtue of the present mode, it is also possible to output audio having a wide frequency band from a deep-bass range to a high range without increasing the number of channels of an in-vehicle acoustic system having a standard four-channel amplifier and without adding a deep bass amplifier.

It should be understood by those skilled in the art that various modifications, combinations, sub-combinations and alterations may occur depending on design requirements and other factors insofar as they are within the scope of the appended claims or the equivalent thereof.

The present disclosure contains subject matter related to that disclosed in Japanese Priority Patent Application JP 2020-100712 filed in the Japan Patent Office on Jun. 10, 2020, the entire content of which is hereby incorporated by reference.

What is claimed is:

1. An in-vehicle acoustic system, comprising:
a first amplifier configured to output a first audio signal to a first mid-range speaker through a first signal path;
a second amplifier configured to output a second audio signal to a second mid-range speaker through a second signal path;
a third amplifier configured to output a third audio signal to a first high-range speaker and a first low-range speaker; and
a fourth amplifier configured to output a fourth audio signal to a second high-range speaker and a second low-range speaker, wherein
the third audio signal is inputted to the first high-range speaker through a third signal path that goes from the third amplifier to the first high-range speaker,
the fourth audio signal is inputted to the second high-range speaker through a fourth signal path that goes from the fourth amplifier to the second high-range speaker,
the first audio signal is inputted to a deep-bass speaker through a fifth signal path that branches from the first signal path,
the third audio signal is inputted to the first low-range speaker through a sixth signal path that branches from the third signal path,
the fourth audio signal is inputted to the second low-range speaker through a seventh signal path that branches from the fourth signal path,
the first mid-range speaker, the first high-range speaker, and the first low-range speaker are on a same side that is one of a left side or a right side of a vehicle,
the second mid-range speaker, the second high-range speaker, and the second low-range speaker are on a side of the vehicle opposite to the first mid-range speaker,
the first high-range speaker, the first low-range speaker, the second high-range speaker, and the second low-range speaker are disposed at a front in a vehicle interior,
the first mid-range speaker, the second mid-range speaker, and the deep-bass speaker are disposed at a rear in the vehicle interior,
a reproduction frequency band of the first low-range speaker expands more on a low range side in comparison to a reproduction frequency band of the first mid-range speaker,
a reproduction frequency band of the second low-range speaker expands more on a low range side in comparison to a reproduction frequency band of the second mid-range speaker,
high frequency noise due to clipping of the first audio signal is not outputted from the first mid-range speaker based on the reproduction frequency band of the first mid-range speaker,
a reproduction frequency band of the first high-range speaker expands more on a high range side in comparison to the reproduction frequency band of the first mid-range speaker,
a reproduction frequency band of the second high-range speaker expands more on a high range side in comparison to the reproduction frequency band of the second mid-range speaker, and
a frequency distribution of the reproduction frequency band of the first low-range speaker, the reproduction frequency band of the first mid-range speaker, the reproduction frequency band of the first high-range speaker, the reproduction frequency band of the second low-range speaker, the reproduction frequency band of the second mid-range speaker, the reproduction frequency band of the second high-range speaker is measured at a rear seat located at the rear of the vehicle.

2. The in-vehicle acoustic system according to claim 1, wherein the reproduction frequency band of the first mid-range speaker expands more on a low range side in comparison to the reproduction frequency band of the first high-range speaker.

3. The in-vehicle acoustic system according to claim 1, further comprising: on a portion of the first signal path between the first mid-range speaker and a branch point where the fifth signal path branches from the first signal path, a first filter for which a cutoff frequency is defined according to a lower limit frequency of the reproduction frequency band of the first mid-range speaker, wherein the first filter is configured to block a signal having a frequency lower than the cutoff frequency.

4. The in-vehicle acoustic system according to claim 1, wherein
the second audio signal is inputted to the deep-bass speaker through an eighth signal path that branches from the second signal path, and
the deep-bass speaker comprises a first voice coil that is connected to the fifth signal path and a second voice coil that is connected to the eighth signal path.

5. An in-vehicle acoustic system, comprising:
a first amplifier configured to output a first audio signal to a first mid-range speaker through a first signal path;
a second amplifier configured to output a second audio signal to a second mid-range speaker through a second signal path;

a third amplifier configured to output a third audio signal to a first full-range speaker through a third signal path; and a fourth amplifier configured to output a fourth audio signal to a second full-range speaker through a fourth signal path, wherein the first audio signal is inputted to a deep-bass speaker through a fifth signal path that branches from the first signal path, the first mid-range speaker and the first full-range speaker are on a same side that is one of a left side or a right side of a vehicle, the second mid-range speaker and the second full-range speaker are on a side of the vehicle opposite to the first mid-range speaker, the first full-range speaker and the second full-range speaker are disposed at a front in a vehicle interior, the first mid-range speaker, the second mid-range speaker, and the deep-bass speaker are disposed at a rear in the vehicle interior, a reproduction frequency band of the first full-range speaker expands more on a low range side and a high range side in comparison to a reproduction frequency band of the first mid-range speaker, a reproduction frequency band of the second full-range speaker expands more on a low range side and a high range side in comparison to a reproduction frequency band of the second mid-range speaker, high frequency noise due to clipping of the first audio signal is not outputted from the first mid-range speaker based on the reproduction frequency band of the first mid-range speaker, and a frequency distribution of the reproduction frequency band of the first mid-range speaker, the reproduction frequency band of the second mid-range speaker, the reproduction frequency band of the first full-range speaker, and the reproduction frequency band of the second full-range speaker is measured at a rear seat located at the rear of the vehicle.

6. A vehicle comprising: the in-vehicle acoustic system according to claim 1.

7. The in-vehicle acoustic system according to claim 1, wherein the fifth signal path that branches from the first signal path does not include a filter.

* * * * *